United States Patent
Alptekin et al.

(10) Patent No.: US 8,643,122 B2
(45) Date of Patent: Feb. 4, 2014

(54) SILICIDE CONTACTS HAVING DIFFERENT SHAPES ON REGIONS OF A SEMICONDUCTOR DEVICE

(71) Applicant: International Business Machines Corporation, Armonk, NY (US)

(72) Inventors: Emre Alptekin, Wappingers Falls, NY (US); Dong-Ick Lee, Fishkill, NY (US); Viraj Y. Sardesai, Hopewell Junction, NY (US); Cung D. Tran, Newburgh, NY (US); Jian Yu, Danbury, CT (US); Reinaldo A. Vega, Wappingers Falls, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/707,058

(22) Filed: Dec. 6, 2012

(65) Prior Publication Data
US 2013/0119483 A1      May 16, 2013

Related U.S. Application Data

(62) Division of application No. 13/097,459, filed on Apr. 29, 2011, now Pat. No. 8,415,250.

(51) Int. Cl.
*H01L 29/417* (2006.01)
*H01L 29/45* (2006.01)
*H01L 29/772* (2006.01)

(52) U.S. Cl.
USPC ............ 257/408; 257/E29.116; 257/E29.271

(58) Field of Classification Search
None
See application file for complete search history.

(56) References Cited

U.S. PATENT DOCUMENTS

| | | | |
|---|---|---|---|
| 5,838,050 A * | 11/1998 | Ker et al. | 257/401 |
| 6,133,105 A | 10/2000 | Chen et al. | |
| 6,153,516 A | 11/2000 | Chien | |
| 6,320,261 B1 * | 11/2001 | Burton et al. | 257/754 |
| 6,593,217 B1 * | 7/2003 | Fujisawa | 438/495 |
| 6,780,700 B2 | 8/2004 | Iguchi et al. | |
| 7,279,430 B2 | 10/2007 | Chang et al. | |
| 7,442,619 B2 | 10/2008 | Luo et al. | |
| 7,510,922 B2 | 3/2009 | Hall et al. | |
| 7,786,538 B2 * | 8/2010 | Tsuchiaki | 257/384 |
| 2008/0079090 A1 * | 4/2008 | Hwang et al. | 257/384 |
| 2008/0237634 A1 * | 10/2008 | Dyer et al. | 257/190 |
| 2009/0311836 A1 * | 12/2009 | Cartier et al. | 438/163 |

(Continued)

OTHER PUBLICATIONS

IBM. "Trench Silicide Contacts"; IP.com, IPCOM000184829D; Jul. 1, 2009.

(Continued)

*Primary Examiner* — Thomas L Dickey
*Assistant Examiner* — Joseph Schoenholtz
(74) *Attorney, Agent, or Firm* — Abdul-Samad A. Adediran

(57) ABSTRACT

A structure and method for fabricating silicide contacts for semiconductor devices is provided. Specifically, the structure and method involves utilizing chemical vapor deposition (CVD) and annealing to form silicide contacts of different shapes, selectively on regions of a semiconductor field effect transistor (FET), such as on source and drain regions. The shape of silicide contacts is a critical factor that can be manipulated to reduce contact resistance. Thus, the structure and method provide silicide contacts of different shapes with low contact resistance, wherein the silicide contacts also mitigate leakage current to enhance the utility and performance of FETs in low power applications.

9 Claims, 9 Drawing Sheets

(56) References Cited

U.S. PATENT DOCUMENTS

| | | | |
|---|---|---|---|
| 2010/0044667 A1 | 2/2010 | Park et al. | |
| 2010/0224936 A1 | 9/2010 | Hokazono | |
| 2010/0224938 A1* | 9/2010 | Zhu | 257/369 |
| 2011/0210395 A1 | 9/2011 | Orlowski et al. | |
| 2011/0284968 A1* | 11/2011 | Lee et al. | 257/368 |
| 2012/0104466 A1* | 5/2012 | Zhu et al. | 257/255 |
| 2012/0119302 A1 | 5/2012 | Pei et al. | |
| 2012/0139015 A1 | 6/2012 | Yu et al. | |
| 2013/0171795 A1* | 7/2013 | Pei et al. | 438/303 |

OTHER PUBLICATIONS

Jang, M.; et al.; "Formation of Erbium-silicide as Source and Drain for Decananometer-scale Schottky Barrier Metal-oxide-semiconductor Field-effort Transistors"; Materials Science and Engineering B 114-115; 2004; pp. 51-55.

Ogura, A.; "NiSi MOCVD for fabricating FinFETs and UTB-SOI devices"; SOI Conference, 2003; pp. 70-71; Sep. 29-Oct. 2, 2003.

Qu, Xin-Ping; "Improved Barrier Properties of Ry/TaSiN Stack on NiSi/Si for Copper Contact Technology"; AMC. SUNY.; Oct. 7, 2010.

Seo, S.-C. et al.; Copper contact metallization for 22 nm and beyond; in Proc. IITC; 2009; pp. 8-10.

Seo, S.-C. et al; "Copper Contact for 22 nm and Beyond: Device Performance and Reliability Evaluation"; Electron Device Letters; IEEE; vol. 31; No. 12; pp. 1452-1454; Dec. 2010.

* cited by examiner

SILICIDE CONTACTS HAVING DIFFERENT SHAPES ON REGIONS OF A SEMICONDUCTOR DEVICE

CROSS-REFERENCE TO RELATED APPLICATIONS

This application is a divisional of, and claims the benefit of the filing date of, U.S. patent application Ser. No. 13/097,459 entitled Method of Forming Silicide Contacts of Different Shapes Selectively on Regions of a Semiconductor Device, filed Apr. 29, 2011.

TECHNICAL FIELD

The present invention relates to semiconductor devices, and more particularly to fabricating silicide contacts of different shapes selectively on regions of a field effect transistor to provide low contact resistance and mitigate leakage current.

BACKGROUND

Semiconductor field effect transistors (FETs) continue to get smaller because of technological improvements in semiconductor fabrication processes. The technological improvements have enabled aggressive down-scaling of FETs, and the aggressive down-scaling has resulted in increased density of electrical components on integrated circuits. However, as FETs get smaller, challenges arise that can negatively impact their utility and performance.

One challenge often encountered in semiconductor fabrication, which arises due to down-scaling of FETs, is the ability to provide FETs with low contact resistance. A contact is an interface material between a FET substrate and interconnect wiring, wherein the interconnect wiring is routed to connect a FET to other integrated circuit components distributed on the surface of the substrate. Thus, contact resistance is the electrical resistance across the interface material, wherein the interface material typically comprises a silicide. A contact can enhance electrical current flow (i.e., reduce resistance) between substrate and interconnect wiring. However, as surface area of contacts decrease, due to the aggressive down-scaling, contact resistance can increase and cause a reduction of FET performance, such as a reduction in transistor switching speed.

A second challenge that arises in semiconductor fabrication, due to down-scaling of FETs, is leakage current. Field effect transistors are often utilized in low power applications, such as low leakage electronic devices that require minimal electrical power consumption. One important application for FETS is in battery operated low leakage electronic devices, wherein battery lifetime is essential.

Leakage power refers to the rate at which electrical energy is consumed by an electronic device that is on, but not performing useful work. Leakage power arises from leakage current that is inherent in FETs. Specifically, leakage current refers to current that flows through a FET when the FET is off but the electronic device utilizing the FET is on, which can result in electrical energy being dissipated even though the electronic device is not performing useful work. As FETs become smaller, the length of the transistor channel region (i.e., the region between the source and drain under the gates) becomes shorter, as well as distances from source and drain contacts to respective body region p-n junctions under the gate, which can result in increased leakage current and electrical energy dissipation. Generally, leakage current is undesirable because electrical energy (e.g., battery power) is dissipated by an electronic device without the device performing useful work. Providing low contact resistance and mitigating leakage current has become increasingly difficult to accomplish as the size of FETs become smaller.

SUMMARY

Presented herein is a structure and method of forming semiconductor field effect transistors (FETs) with silicide contacts of different shapes, on source and drain regions of the FETs, utilizing chemical vapor deposition (CVD). The structure and method provided focuses on forming contacts for source and drain regions of FETs, but the structure and method may also be utilized to form other types of contacts for FETs.

Specifically, the silicide contacts of different shapes can be formed on source regions and drain regions utilizing CVD, wherein the shapes of the contacts can be chosen to provide low contact resistance, and wherein distances of the silicide contacts from transistor channel regions (i.e., a portion of the region between the source and drain under the gate) can be adjusted/tuned to mitigate leakage current. Utilization of CVD to deposit silicide contact material can reduce void formations and large variations of final silicide contact shapes that can occur with physical vapor deposition (PVD) techniques, such as sputtering. Thus, shape and uniformity of the silicide contacts are important factors in controlling contact resistance. Providing low contact resistance and mitigating leakage current can enhance the utility and performance of FETs mostly in low power applications.

A first aspect of the embodiments provides a semiconductor device comprising: a substrate; a source region and a drain region of the semiconductor device grown on the substrate; a gate disposed on the substrate between the source region and the drain region; an interlayer dielectric disposed on the source region and the drain region, and disposed on and adjacent to the gate; openings inside the interlayer dielectric to the source region, and to the drain region; one or more shaped surface areas on the source region and the drain region, wherein the one or more shaped surface areas are semicircular surface areas, hexagonal-like surface areas, pentagonal-like surface areas, or bowl-shaped and brimmed surface areas; a contact layer disposed on and adjacent to the interlayer dielectric, and the one or more shaped surface areas, wherein the contact layer provides a contact conformal to the one or more shaped surface areas; a metal layer disposed on and adjacent to the contact layer; a planarized surface, wherein a portion of the contact layer and a portion of the metal layer are removed selective to the interlayer dielectric; and a capping layer disposed on the planarized surface.

A second aspect of the embodiments provides a method of forming a semiconductor device. The method includes the steps of: providing a substrate; growing a source region and a drain region of the semiconductor device on the substrate; forming a gate disposed on the substrate between the source region and the drain region; forming an interlayer dielectric covering the source region and the drain region, and disposed on and adjacent to the gate; forming openings inside the interlayer dielectric, wherein the openings expose the source region and the drain region underneath the interlayer dielectric; forming one or more shaped surface areas on the source region and the drain region exposed by the openings, wherein the one or more shaped surface areas are semicircular surface areas, hexagonal-like surface areas, pentagonal-like surface areas, or bowl-shaped and brimmed surface areas; forming a contact layer disposed on and adjacent to the interlayer dielectric, and the one or more shaped surface areas, wherein the contact layer provides a contact conformal to the one or more shaped surface areas; forming a metal layer disposed on and adjacent to the contact layer; forming a planarized surface, wherein a portion of the contact layer and a portion of the metal layer are removed selective to the interlayer dielectric; and forming a capping layer disposed on the planarized surface.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1A:
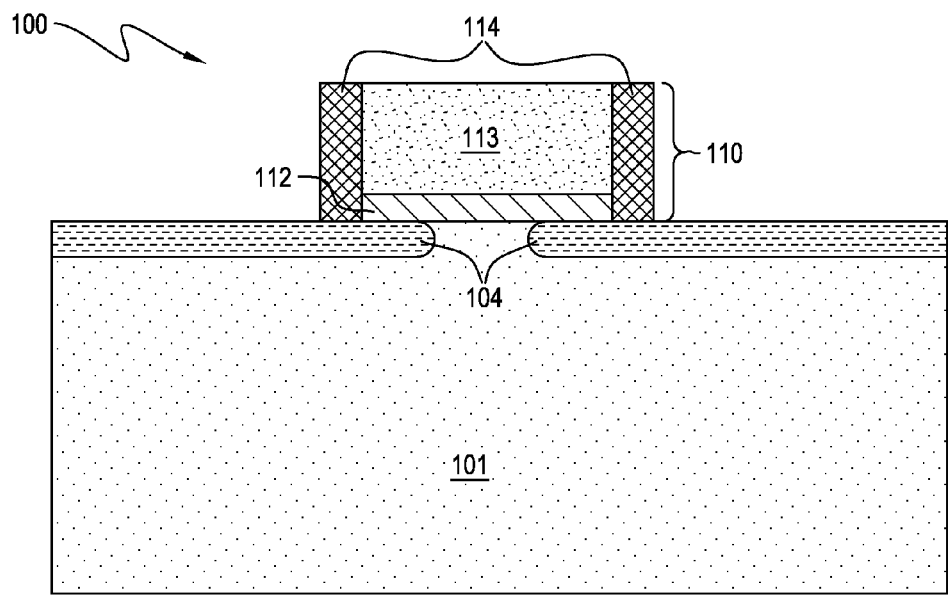
FIGS. 1A-1E are cross-sectional views of semiconductor structures at various relevant stages of fabrication, utilizing a semicircular-shaped surface area on source and drain regions, to form silicide contacts of a semiconductor field effect transistor according to one embodiment of the present invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

References in the specification to "one embodiment", "an embodiment", "an example embodiment", "an alternative embodiment", "another embodiment", etc., indicate that the embodiment described may include a particular feature, element, structure, or characteristic, but every embodiment may not necessarily include the particular feature, element, structure, or characteristic. Moreover, such phrases are not necessarily referring to the same embodiment.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provide semiconductor field effect transistors (FETs) with silicide contacts of different shapes formed on source regions and drain regions at a distance from transistor channel regions, wherein the shape of the silicide contact can provide low contact resistance, and wherein the distance from the transistor channel regions is adjustable/tunable such that leakage current is mitigated. Lowering contact resistance and mitigating leakage current can enhance the utility and performance of FETs in low power applications. Moreover, in the present embodiment a semiconductor structure and method are described in the context of replacement metal gate processing, wherein first a dummy gate is formed, and wherein the dummy gate is later replaced with a final gate stack during front-end-of-line processing prior to formation of silicide contacts. However, the structure and method described herein is also applicable in the context of gate first processing, wherein the gate is formed followed by formation of source-drain extensions, source and drain regions, and the rest of front-end-of-line processing prior to formation of silicide contacts.

FIG. 1A illustrates a cross-sectional view of semiconductor 100, wherein gate 110 and source-drain extensions 104 can be formed prior to silicide contact formation. In the present embodiment, semiconductor 100 is fabricated using a substrate 101 that comprises bulk silicon. In alternative embodiments, semiconductor 100 may be fabricated utilizing semiconductor-on-insulator technology, wherein substrate 101 includes silicon or any other semiconductor material disposed on an oxide layer. Thus, substrate 101 is not limited to only silicon based materials. For example, substrate 101 may comprise germanium (Ge), silicon-carbon (SiC), or other group IV materials. Alternatively, substrate 101 may comprise gallium arsenide (GaAs), aluminum gallium arsenide (AlGaAs), indium arsenide (InAs), or other group III/V materials. In addition, the number of gates corresponds to the number of FETs. Thus, semiconductor 100 illustrates a single FET, but additional FETs of the same or different doping profiles (i.e., n-type FETs or p-type FETs) may be formed utilizing substrate 101. The additional FETs can be separated from each other using isolation regions (e.g., shallow trench isolation regions and/or optional junction-butting implants) to electrically decouple portions of the FETs.

Specifically, semiconductor 100 comprises substrate 101, source-drain extensions 104, and gate 110. In addition, gate 110 further comprises gate dielectric layer 112, poly-silicon and/or metal layer 113, and dielectric spacer 114. Gate dielectric layer 112 can comprise an oxide such as silicon dioxide, hafnium oxide, zirconium oxide, or a combination thereof, such as hafnium oxide disposed on silicon dioxide. In addition, gate dielectric layer 112 can be deposited on a portion of substrate layer 101 utilizing a variety of deposition techniques, which can include chemical vapor deposition (CVD), or atomic layer deposition (ALD). Dielectric spacer 114 can comprise nitride, oxide, or any other dielectric material. Gate 110 can comprise a metal layer that can include, but is not limited to, aluminum (Al), hafnium (Hf), lanthanum (La), tantalum (Ta), titanium (Ti), or zirconium (Zr). The metal layer can be deposited on gate dielectric layer 112 utilizing a CVD technique, a physical vapor deposition (PVD) technique, or any other deposition technique. Furthermore, if gate 110 comprises a metal layer, a poly-silicon layer can be deposited on the metal layer. However, poly-silicon is not often utilized in a final replacement metal gate stack, because poly-silicon has a higher resistance than that of metal. Subsequent to formation of poly-silicon and/or metal layer 113, dielectric spacer 114 is formed and disposed adjacent to sidewalls of the poly-silicon and/or metal layer and gate dielectric layer 112. In addition, dielectric spacer 114 is disposed on portions of substrate 101. The dielectric spacer 114 typically has a width ranging from about 2.0 nm to 15.0 nm.

In the present embodiment, at a fabrication stage after formation of gate 110, source-drain extensions 104 can be formed in substrate 101 under the gate. Specifically, source-drain extensions 104 can be formed utilizing an implant technique, such as ion implantation of ion dopants into substrate 101 followed by an annealing process. The annealing process can cause the ion dopants to diffuse deeper and laterally into substrate 101, and diffuse slightly under gate 110. However, in an alternative embodiment source-drain extensions 104 can be formed after epitaxial growth of source and drain regions by utilizing ion implantation and/or in-situ doping followed by annealing, wherein the annealing can cause ion dopants to diffuse deeper and laterally into substrate 101 and slightly under gate 110. Annealing temperatures can range from about 900° C.-1300° C. depending on the type of anneal performed. At a fabrication stage after formation of source-drain extensions 104 in substrate 101, trenches are formed in the substrate.

Figure 1B:
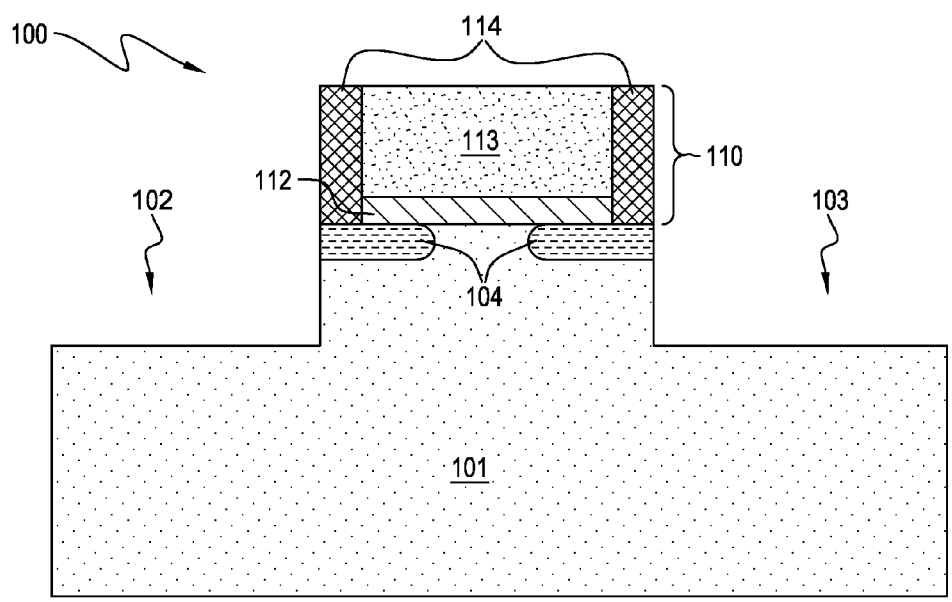

FIG. 1B illustrates a cross-sectional view of semiconductor 100, wherein trenches 102 and 103 are formed in substrate 101 utilizing reactive ion etching (RIE) or any other etching/removal technique. In the present embodiment, portions of substrate 101 and portions of source-drain extensions 104 are removed via anisotropic RIE to form trenches 102 and 103. The formation of trenches 102 and 103 clears the way for the formation of source and drain regions. However, in alternative embodiments, source and drain regions may be formed by ion implantation followed by annealing, without etching away any of substrate 101 to form trenches 102 and 103. Accordingly, source regions and drain regions can comprise epitaxial material, in-situ doped epitaxial material, ion implanted and annealed semiconductor material, or a combination thereof.

Figure 1C:
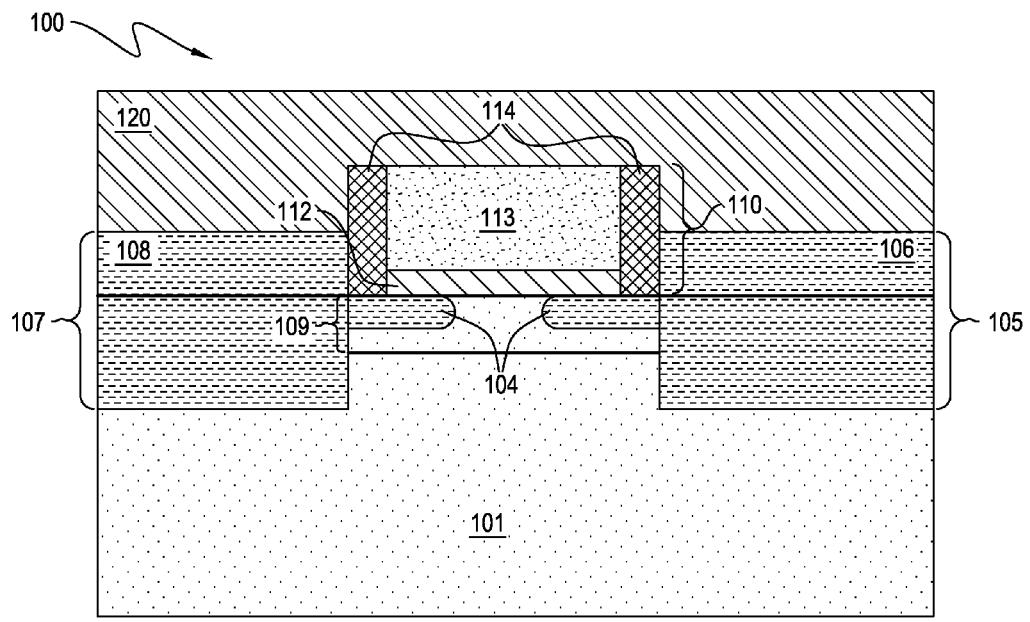

FIG. 1C illustrates a cross-sectional view of semiconductor 100, wherein source region 105, drain region 107, and inter-layer dielectric 120 are formed prior to silicide contact formation. The source region 105 can comprise a raised source region 106, and the drain region 107 can comprise a raised drain region 108. The formation of source region 105 and drain region 107 provides a transistor channel region 109, across a portion of substrate 101, for current to follow from source to drain.

If semiconductor 100 is a p-type transistor then source region 105 and drain region 107 can be grown epitaxially and comprise silicon-germanium (SiGe), which can be doped with p-type dopants that can include boron (B), aluminum (Al), gallium (Ga), or indium (In). The germanium (Ge), in silicon-germanium (SiGe), acts as a stressor to improve the mobility of holes between source and drain. However, if semiconductor is an n-type transistor then source region 105 and drain region 107 can be grown epitaxially and comprise silicon-carbon ($Si_{1-x}C_x$), which can be doped with n-type dopants that can include phosphorus (P), arsenic (As), or antimony (Sb). The carbon (C), in silicon-carbon ($Si_{1-x}C_x$), can act as stressor to improve the mobility of electrons between source and drain.

Raised source region 106 and raised drain region 108 can be grown epitaxially to a height (i.e., about 10-30 nm) that can be adjusted/tuned to minimize leakage current, wherein the leakage current can result from transistor channel region 109 (i.e., a portion of body region between the source and the drain under the gate) becoming shorter due to down-scaling of FETs. Transistor channel region 109 is the region where current can flow when semiconductor 100 is on. In addition, leakage current can result from a source contact being too close in proximity to the p-n junction that is between source region 106 and the body region, wherein the body region is a portion of substrate 101 that is between the source region and drain region 107. Likewise, leakage current can result from a drain contact being too close in proximity to the p-n junction between drain region 107 and the body region. Accordingly, forming contacts in raised source region 106 and raised drain region 108 minimizes leakage current by moving the contacts a sufficient distance away from respective p-n junctions.

Moreover, source region 105, raised source region 106, drain region 107, and raised drain region 108 can be stressed or unstressed, and/or doped or undoped. In addition, interlayer dielectric 120 can be deposited over raised source region 106, gate 110, and raised drain region 108 utilizing CVD, wherein the type of CVD can include low pressure CVD or flowable CVD. Specifically, interlayer dielectric 120 can comprise an oxide such as silicon dioxide, a nitride such as silicon nitride, or a combination thereof. It is often desirable for interlayer dielectric 120 to have a dielectric constant of less than 5.0, in order to enhance signal speed and minimize signal crosstalk (i.e., crosstalk refers to a signal being transmitted through a interconnect/metal line, and affecting another signal being transmitted through a separate interconnect/metal line, and/or affecting other parts of circuitry in an undesired manner).

Figure 1D:
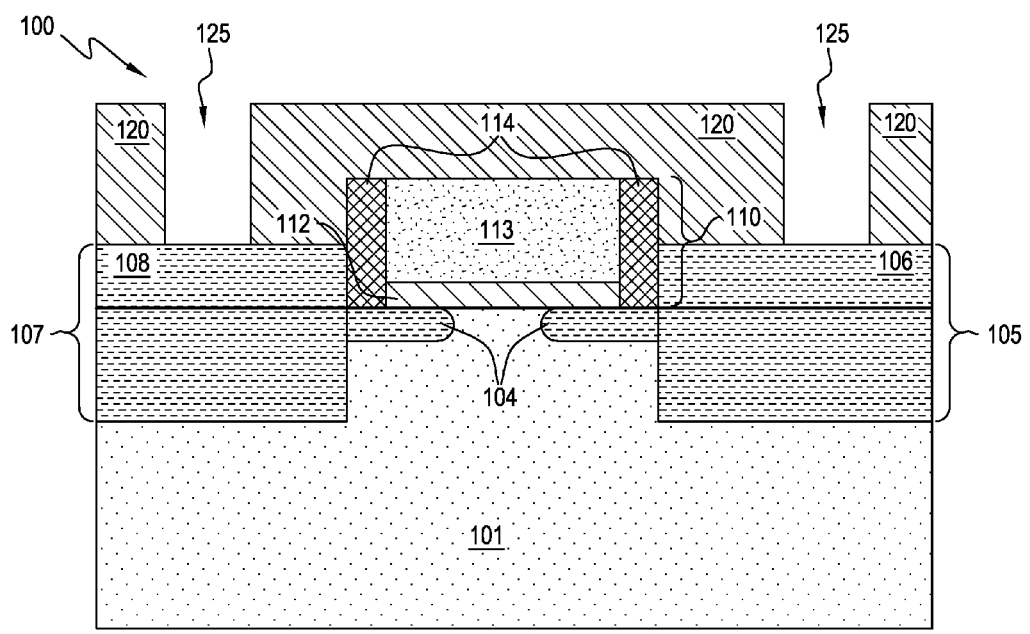

FIG. 1D illustrates the formation of openings comprising via holes 125 in interlayer dielectric 120 of semiconductor 100, which can be performed by utilizing RIE or any other etching/removal technique. However, in the present embodiment, portions of interlayer dielectric 120 are removed via anisotropic RIE to form via holes 125.

Figure 1E:
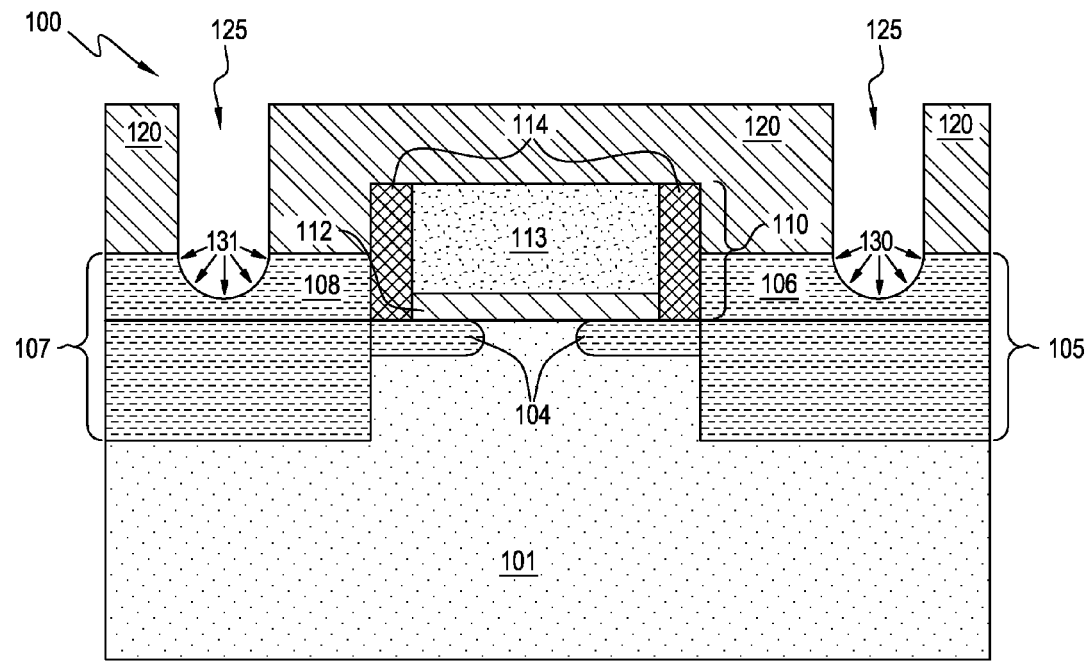

FIG. 1E illustrates the formation of semicircular-shaped surface areas 130 and 131 on raised source region 106 and raised drain region 108, respectively. The semicircular-shaped surface areas 130 and 131 can be formed utilizing etching techniques that include wet etching, dry etching, plasma etching, isotropic RIE, anisotropic RIE, ion milling, or any combination thereof. For example, a plasma etch or dry etch can be controlled such that an isotropic etch is achieved, which can form semicircular-shaped surface areas 130 and 131. The shape of surface areas 130 and 131 are important factors that can impact contact resistance. For example, semicircular-shaped surface areas may provide the most amount of contact area, which can result in low contact resistance. Contact resistance can be understood as the resistance across an interface, wherein the interface is between substrate 101 and interconnect metal in via holes 125. High contact resistance can cause FETs to operate with slower switching speeds.

Figure 1F:
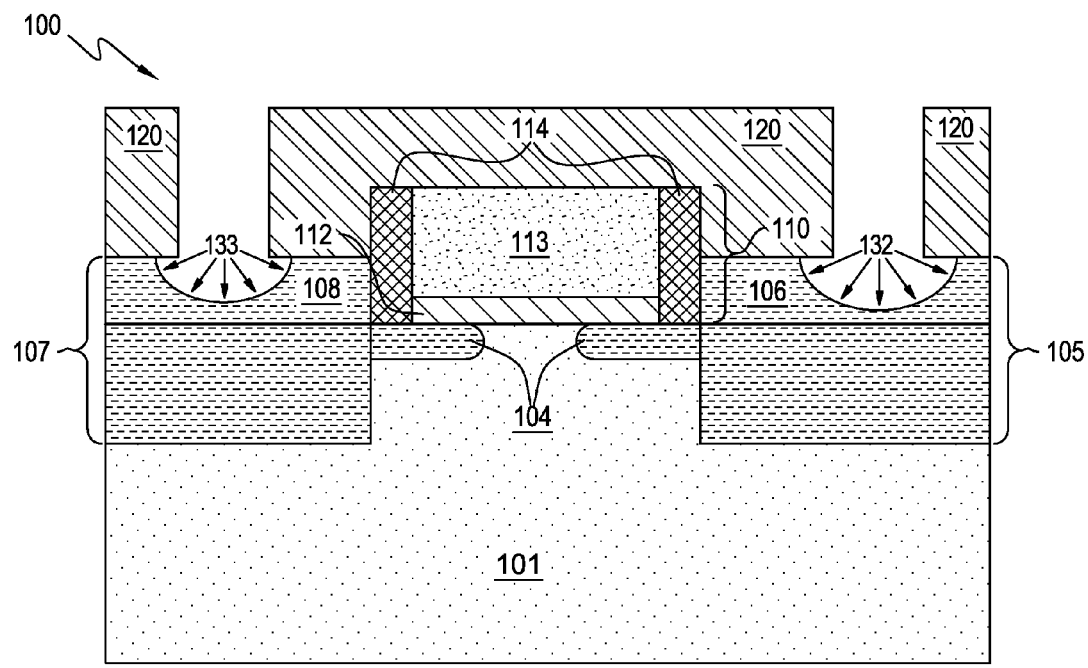
FIG. 1F is an alternative embodiment depicting a cross-sectional view of semiconductor structures at a stage of fabrication, wherein a semicircular-shaped surface area on the source region has a different size than the semicircular-shape formed on the drain region according to one embodiment of the present invention.

However, the surface area etched for contacts are not the only determining factor that can affect the amount of contact resistance. The type of crystal planes that form the surface area for a contact is another factor that can affect contact resistance. For example, if a contact can be formed on and adjacent to crystal planes that provide a lower contact energy barrier height, then less contact area would be required to maintain or achieve a lower contact resistance. Thus, surface areas of different shapes can be formed on raised source region 106 and raised drain region 108 to provide low contact resistance and crystal planes with lower contact energy barrier heights. Moreover, in the present embodiment, semicircular-shaped surface areas 130 and 131 are the same size. However, FIG. 1F illustrates an alternative embodiment wherein semicircular-shaped surface areas 132 and 133 are each formed to have different sizes with respect to each other, and wherein the different sizes can be utilized to reduce short-channel effects and high-field effects, such as hot carrier injection.

Figure 1G:
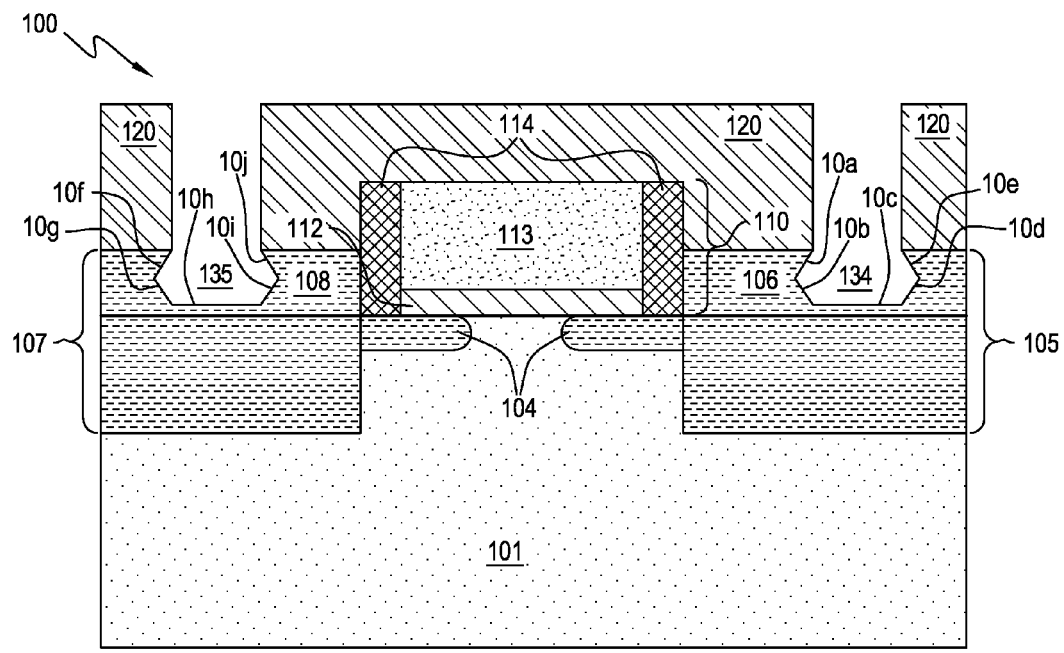
FIG. 1G is an alternative embodiment depicting a cross-sectional view of semiconductor structures at a stage of fabrication, utilizing a hexagonal-like shaped surface area on source and drain regions, to form silicide contacts of a semiconductor field effect transistor according to one embodiment of the present invention.

FIG. 1G illustrates an alternative embodiment, wherein surface areas of a different shape are formed. Specifically, hexagonal-like shaped surface areas 134 and 135 can be formed in raised source region 106 and raised drain region 108 utilizing ammonium hydroxide or potassium hydroxide to perform a wet etch. A wet etch utilizing ammonium hydroxide or potassium hydroxide can etch into raised source region 106 and raised drain region 108, across different crystal planes, to form hexagonal-like shaped surface areas 134 and 135. Moreover, etch chemistries such as ammonium hydroxide or potassium hydroxide tend to etch along all crystal planes with the exception of {111} crystal planes 10a-10j. Specifically, etch chemistries tend to self-terminate along {111} crystal planes 10a-10j. Thus, the {111} crystal planes 10a-10j act as an etch stop, such that hexagonal-like shaped surface areas 134 and 135 can be formed.

A second way to form hexagonal-like shaped surface areas 134 and 135 is to implant dopants into raised source region 106 and raised drain region 108, and subsequently perform a dry etch or plasma etch of the raised source region and the raised drain region. For example, if the semiconductor 100 is an n-type semiconductor, raised source region 106 and raised drain region 108 can comprise silicon or silicon-carbon ($Si_{1-x}C_x$), wherein the raised source region and the raised drain region layer may be doped with n-type dopants that can include phosphorus (P), arsenic (As), or antimony (Sb), and wherein chlorine (Cl) can be utilized to perform a dry etch or plasma etch of the silicon-carbon that is doped with the n-type dopants.

A third way to form hexagonal-like shaped surface areas 134 and 135 is to utilize an in-situ etch, wherein all required etching steps can be performed within a single etch chamber and under continuous vacuum conditions. The in-situ etch involves performing an anisotropic RIE (i.e., etching straight down) of raised source region 106 and raised drain region 108 followed by a chlorine etch of the raised source region and the raised drain region, wherein the chlorine etch will self terminate along stable {111} crystal planes 10a-10j. Thus, the {111} crystal planes 10a-10j act as an etch stop, such that hexagonal-like shaped surface areas 134 and 135 can be formed.

A fourth way to form hexagonal-like shaped surface areas 134 and 135 is to perform a controlled plasma etch or a controlled dry etch into raised source region 106 and raised drain region 108, which can be utilized to form initial semicircular surface areas. Subsequently, a wet etch or additional dry etch can be performed in order to etch isotropically and transform the semicircular surface areas into hexagonal-like shaped surface areas 134 and 135. Specifically, the additional dry etch can be performed utilizing etch chemistries that can include sulfur hexafluoride ($SF_6$), trifluoromethane ($CHF_3$), hydrogen bromide (HBr), or a combination thereof in an etch chamber that is operating at low radio frequency (RF) power. The radio frequency power in an etch chamber can be adjusted to control directionality of an etch, such that the etch can become less anisotropic and more isotropic. Moreover, other etch chemistries and chamber conditions can be utilized to accomplish a desired isotropically etched surface area.

Figure 1H:
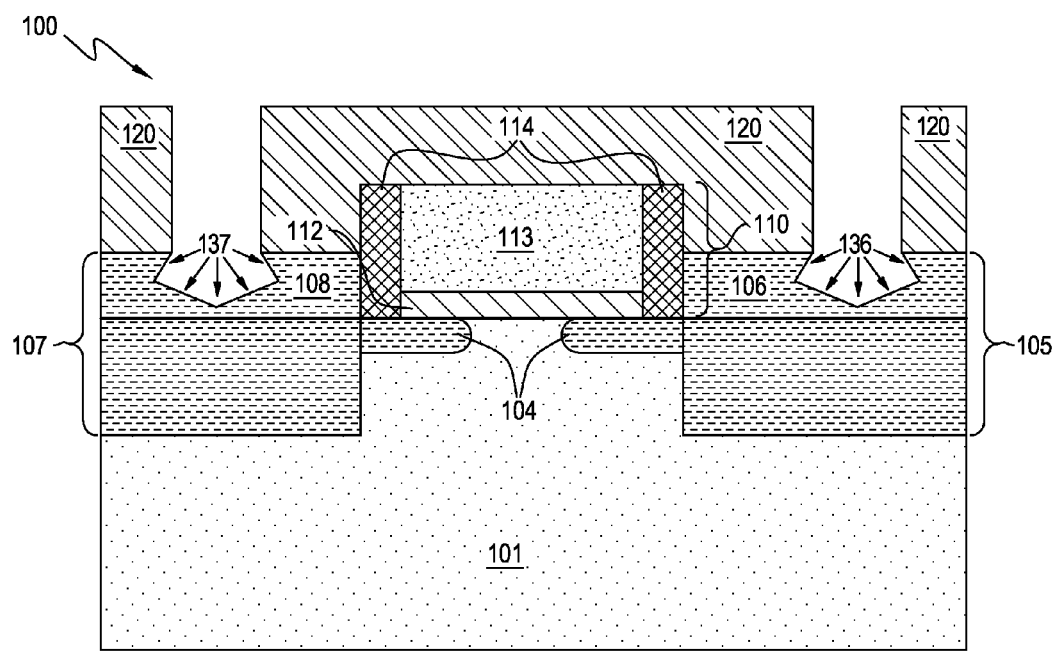
FIG. 1H is an alternative embodiment depicting a cross-sectional view of semiconductor structures at a stage of fabrication, utilizing a pentagonal-like shaped surface area on source and drain regions, to form silicide contacts of a semiconductor field effect transistor according to one embodiment of the present invention.

Moreover, FIG. 1H is an alternative embodiment illustrating the formation of pentagonal-like shaped surface areas 136 and 137 formed in raised source region 106 and raised drain region 108, respectively, utilizing ammonium hydroxide or potassium hydroxide to perform a wet etch. However, whether hexagonal-like shaped surface areas 134 and 135 (shown in FIG. 1G) or pentagonal like surface areas 136 and 137 are formed will depend on etch depth and length of the surface areas.

Figure 1I:
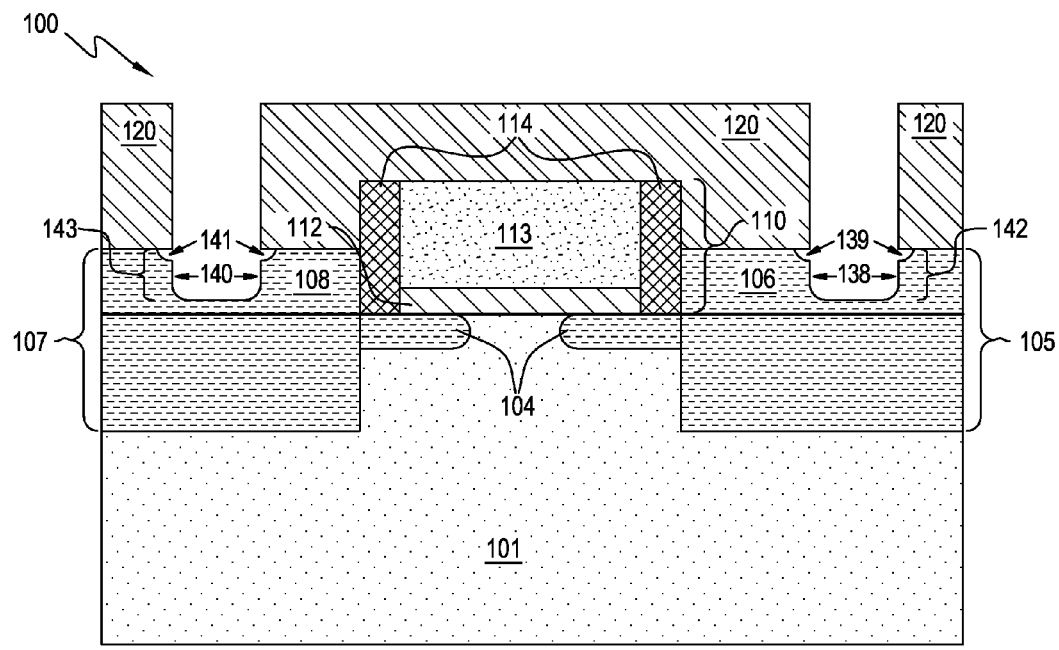
FIG. 1I is an alternative embodiment depicting a cross-sectional view of semiconductor structures at a stage of fabrication, utilizing a bowl-shaped and brimmed surface area on source and drain regions, to form silicide contacts of a semiconductor field effect transistor according to one embodiment of the present invention.

FIG. 1I is another alternative embodiment illustrating the formation of bowl-shaped and brimmed surface areas 142 and 143 in raised source region 106 and raised drain region 108, respectively. The bowl-shaped and brimmed surface area 142 comprises a bowled-shaped surface area 138, and a brimmed surface area 139 over the bowled-shaped surface area 138. In addition, the bowl-shaped and brimmed surface area 143 comprises a bowl-shaped surface area 140, and a brimmed surface area 141 over the bowl-shaped surface area 140. The bowl-shaped and brimmed surface areas 142 and 143 are formed utilizing a sequential etching technique that can include wet etching, dry etching, plasma etching, isotropic RIE, anisotropic RIE, ion milling, or any combination thereof. For example, bowl-shaped and brimmed surface areas 142 and 143 can be formed by performing a first plasma etch or a first dry etch of raised source region 106 and raised drain region 108, which can be controlled such that bowl-shaped surface areas 138 and 140 are formed, followed by a second plasma etch or a second dry etch controlled to form brimmed surface areas 139 and 141. Thus, by performing a combination of controlled etches, bowl-shaped and brimmed surface areas 142 and 143 can be formed in raised source region 106 and raised drain region 108, respectively.

Furthermore, brimmed surface areas 139 and 141 can also be formed by performing a shallow n-type dopant implant (i.e., shallower than the isotropic etch depth of bowl-shaped surface areas 138 and 140) in a portion of raised source region 106 and raised drain region 108, and subsequently performing a selective etch to remove the portion of the raised source region and raised drain region that were implanted with the n-type dopants. The bowl-shaped and brimmed surface areas 142 and 143 can reduce contact resistance by providing more surface area to form source and drain contacts.

Figure 1J:
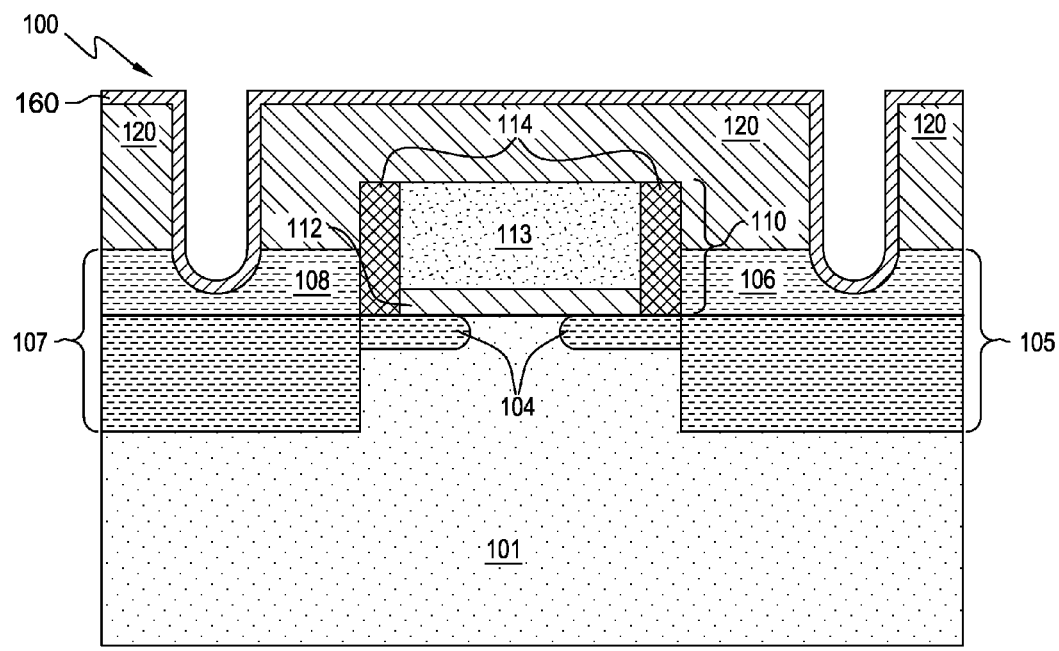
FIGS. 1J-1N are cross-sectional views of semiconductor structures at various relevant stages of fabrication, utilizing a semicircular-shaped silicide contact on source and drain regions of a semiconductor field effect transistor according to one embodiment of the present invention.

FIG. 1J illustrates the formation of contact layer 160 on and adjacent to interlayer dielectric 120, raised source region 106, and raised drain region 108. Contact layer 160 can comprise silicides with refractory metals (e.g., nickel, platinum, or cobalt), rare-earth metals (e.g., erbium, dysprosium, yttrium), and/or a different phase orientation, and/or a different ternary form of silicides, and/or a combination thereof. However, in the present embodiment, di-nickel silicide ($Ni_2Si$) is utilized to form contact layer 160, because di-nickel silicide ($Ni_2Si$) can be deposited and annealed to effectively remove excess nickel (Ni) that has not reacted with silicon (Si) that comprises raised source region 106 and raised drain region 108. Specifically, di-nickel silicide ($Ni_2Si$), utilized to form contact layer 160, can be deposited by performing CVD. CVD can minimize pinch-off by providing conformal deposition of the di-nickel silicide ($Ni_2Si$) adjacent to sidewalls of via holes 125 (shown in FIG. 1D) and on and adjacent to semicircular-shaped surface areas 130 and 131 (shown in FIG. 1E). Pinch-off refers to build up of deposited material at an opening of a trench or a via hole. Pinch-off can result in void formation, wherein parts of a trench surface area and/or parts of a via hole surface area are not covered with the deposited material.

Figure 1K:
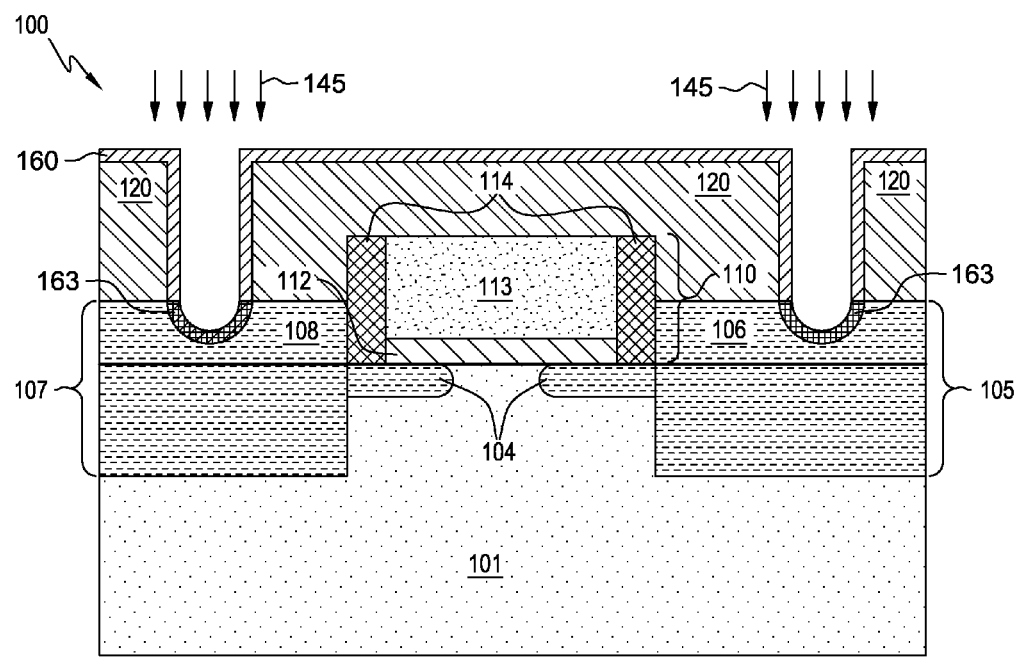

FIG. 1K illustrates an anneal 145 that can be performed subsequent to the deposition of contact layer 160 and before the deposition of a metal layer over the contact layer, wherein the contact layer can comprise di-nickel silicide ($Ni_2Si$). However, in an alternative embodiment anneal 145 can be performed after deposition of a metal layer over contact layer 160. The anneal 145 causes excess nickel of the di-nickel silicide ($Ni_2Si$), of contact layer 160, to react with silicon (Si) of raised source region 106 and raised drain region 108 to form nickel silicide (NiSi) semicircular-shaped contacts 163, wherein the nickel silicide (NiSi) semicircular-shaped contacts are on and adjacent to surface areas 130 and 131 (shown in FIG. 1E). The anneal can cause a portion of nickel silicide (NiSi) semicircular-shaped contacts 163 to diffuse slightly below the raised source region 106 and the raised drain region 108.

In addition, since contact layer 160 comprises a nickel silicide (NiSi or $Ni_2Si$), the contact layer can act as a diffusion barrier to mitigate interconnect conductive material, such as copper (Cu), from diffusing into interlayer dielectric 120. Diffusion of conductive material into interlayer dielectric 120 can result in leakage current. Thus, contact layer 160 minimizes leakage current by mitigating the diffusion of conductive material into interlayer dielectric 120.

Figure 1L:
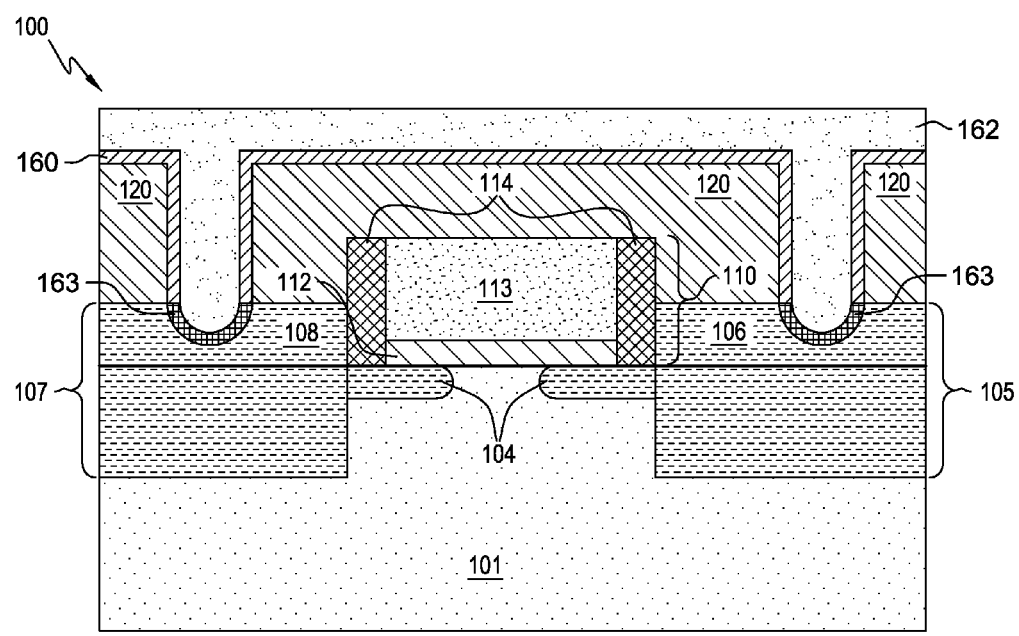

FIG. 1L illustrates the formation of metal layer 162, which can comprise tungsten (W), a tungsten alloy, copper (Cu), or a copper alloy. Metal layer 162 provides electrical connectivity between semiconductor 100 and other electrical components distributed on substrate 101. In the present embodiment, metal layer 162 comprises tungsten (W). In an alternative embodiment, metal layer 162 can be a layer comprising copper or a copper-manganese alloy. Furthermore, if the contact layer 160 comprises a silicide, the contact layer can act as an adhesion layer between the metal layer 162 and interlayer dielectric 120. However, in an alternative embodiment, a separate adhesion layer can be deposited on and adjacent to interlayer dielectric 120, wherein the separate adhesion layer is between contact layer 160 and the interlayer dielectric, and wherein the separate adhesion layer can comprise titanium (Ti) or titanium nitride (TiN). Moreover, anneal 145 (shown in FIG. 1K), which was performed at an earlier stage in the fabrication process, can also be performed after deposition of metal layer 162 in order to form nickel silicide (NiSi) semicircular-shaped contacts 163.

Figure 1M:
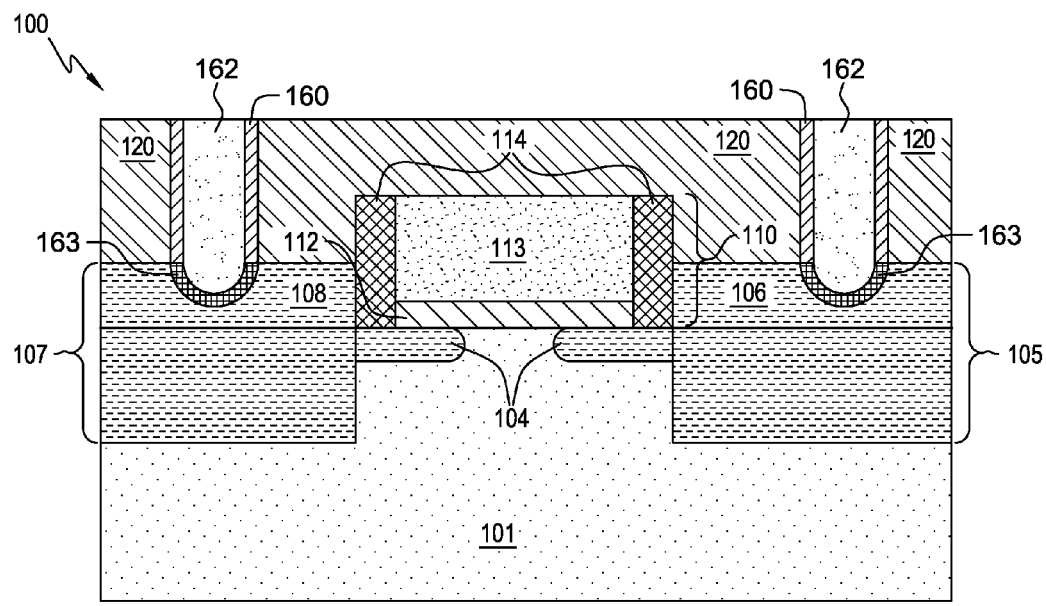

FIG. 1M illustrates an end result of a chemical-mechanical planarization (CMP) process. The purpose of the CMP process is to remove a portion of contact layer 160 and metal layer 162, selective to interlayer dielectric 120, which provides for the formation of a quality interconnect structure, and clears the way for forming a dielectric layer capping layer.

Figure 1N:
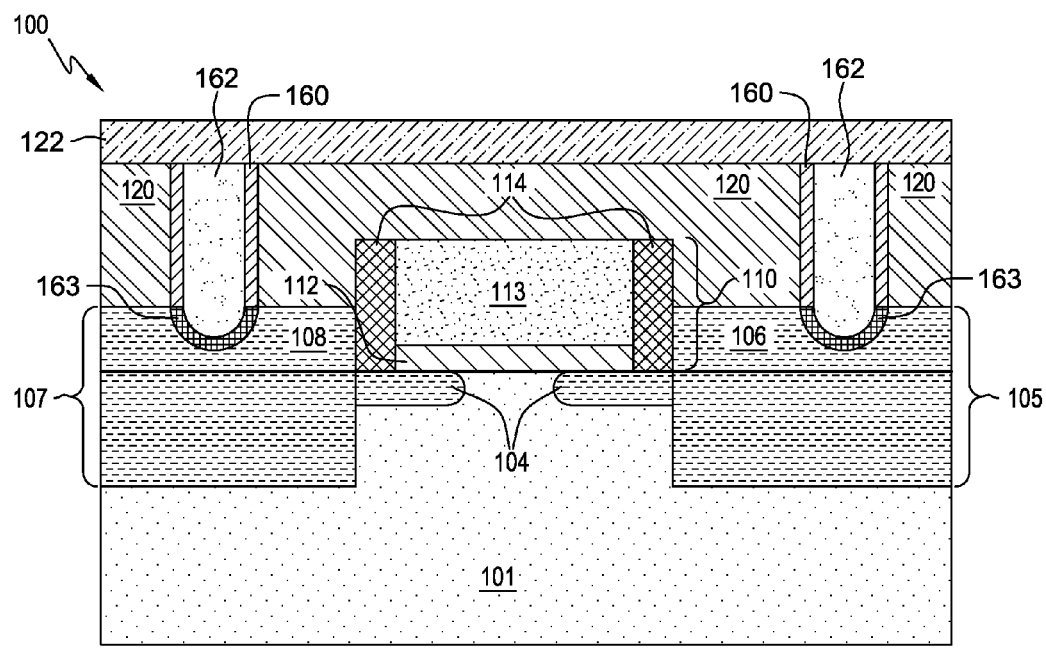

FIG. 1N illustrates the formation of a dielectric capping layer 122. Dielectric capping layer 122 is formed after the CMP process illustrated in FIG. 1M. The dielectric capping process can occur at temperatures high enough to enhance metal grain growth of metal layer 162, and enhance diffusion of metal atoms that comprise the metal layer. Additionally, a via hole opening can be created in dielectric capping layer 122 to provide connectivity to a subsequent metal layer.

Figure 1O:
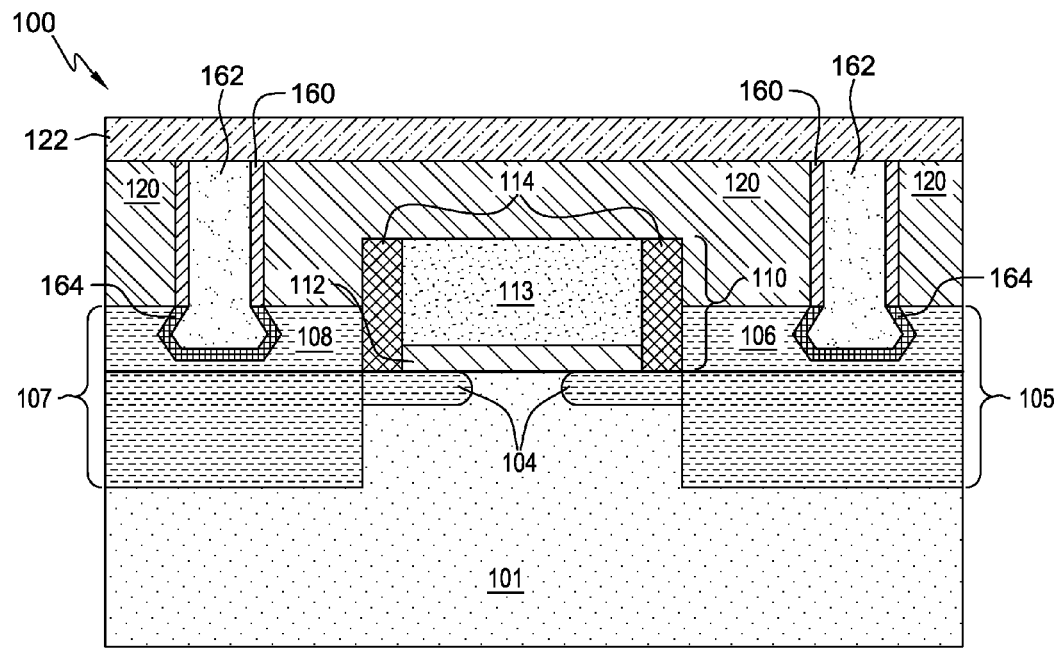
FIG. 1O is an alternative embodiment depicting a cross-sectional view of semiconductor structures at a stage of fabrication, utilizing a hexagonal-like shaped silicide contact on source and drain regions of a semiconductor field effect transistor according to one embodiment of the present invention.

FIG. 1O illustrates an alternative embodiment, wherein nickel silicide hexagonal-like shaped contacts 164 are formed on and adjacent to surface areas 134 and 135 (shown in FIG. 1G) of raised source region 106 and raised drain region 108, respectively. Hexagaonal-like shaped contacts 164 reduce contact resistance because of contact material formed along {111} crystal planes 10a-10j (shown in FIG. 1G), wherein the {111} crystal planes provides a lower contact energy barrier height. Another advantage of hexagonal-like shaped contacts 164 is that they have sharp edges at which there can be high electric fields that can increase current flow across the interface of the contacts, thereby reducing contact resistance.

Figure 1P:
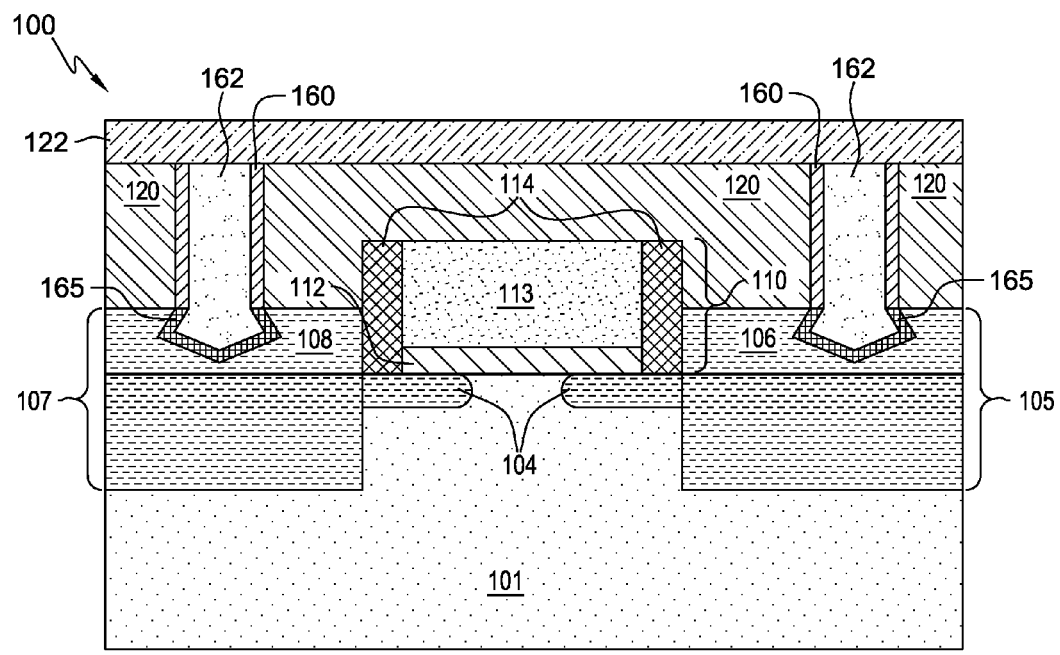
FIG. 1P is an alternative embodiment depicting a cross-sectional view of semiconductor structures at a stage of fabrication, utilizing a pentagonal-like shaped silicide contact on source and drain regions of a semiconductor field effect transistor according to one embodiment of the present invention.

FIG. 1P illustrates an alternative embodiment, wherein nickel silicide pentagonal-like shaped contacts 165 are formed on and adjacent to surface areas 136 and 137 (shown in FIG. 1H) of raised source region 106 and raised drain region 108, respectively. Similar to hexagonal-like shaped contacts 164 (shown in FIG. 1O), an advantage of pentagonal-like shaped contacts 165 is that they have sharp edges at which there can be high electric fields that can increase current flow across the interface of the contacts, thereby reducing contact resistance.

Figure 1Q:
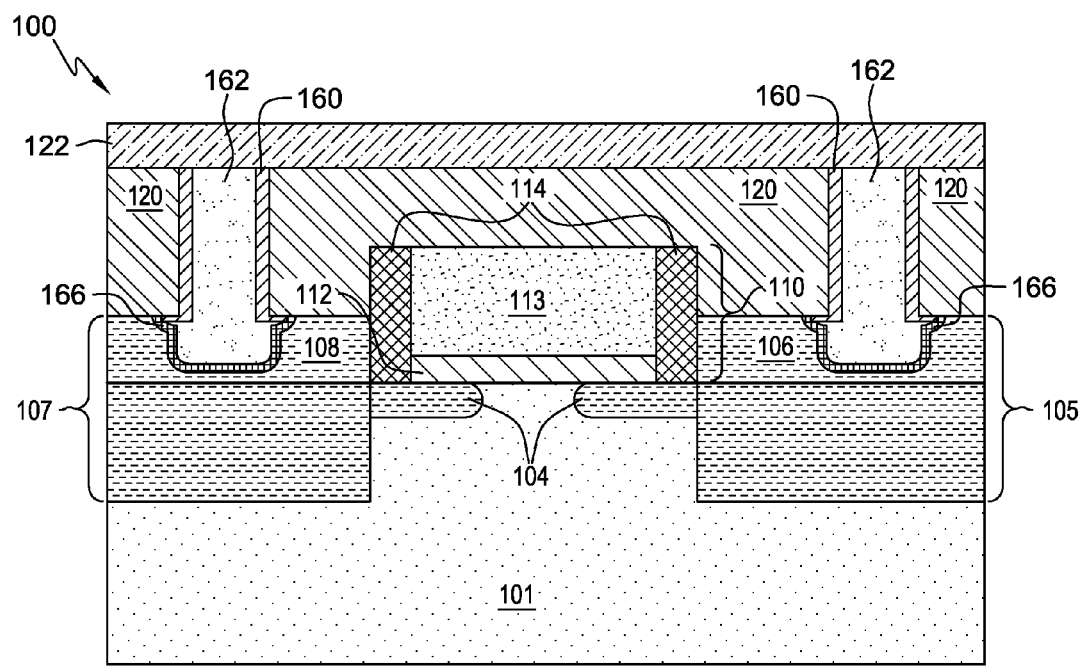
FIG. 1Q is an alternative embodiment depicting a cross-sectional view of semiconductor structures at a stage of fabrication, utilizing a bowl-shaped and brimmed silicide contact on source and drain regions of a semiconductor field effect transistor according to one embodiment of the present invention.

FIG. 1Q illustrates an alternative embodiment, wherein bowl-shaped and brimmed contacts 166 are formed on and adjacent to surface areas 142 and 143 (shown in FIG. 1I) of raised source region 106 and raised drain region 108, respectively. An advantage of bowl-shaped and brimmed contacts 166 is that they provide a large high amount of contact area, wherein the amount of contact area is a factor that can reduce contact resistance.

Furthermore, those skilled in the art will note from the above description, that presented herein is a novel structure and method to form a semiconductor field effect transistor (FET) utilizing silicide contacts of different shapes selectively on regions of the FET, such as source and drain regions, to provide low contact resistance and mitigate leakage current. Providing low contact resistance and mitigating leakage current can enhance the utility and performance of FETs mostly in low power applications. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A semiconductor device comprising:
    a substrate;
    a source region and a drain region of the semiconductor device grown on the substrate;
    a gate disposed on the substrate between the source region and the drain region;
    an interlayer dielectric disposed on the source region and the drain region, and disposed on and adjacent to the gate;
    openings inside the interlayer dielectric to the source region, and to the drain region;
    one or more shaped surface areas on the source region and the drain region, wherein the one or more shaped surface areas are hexagonal-like surface areas, pentagonal-like surface areas, or brimmed surface areas;
    a contact layer disposed on and adjacent to the interlayer dielectric, and the one or more shaped surface areas, wherein the contact layer provides a contact conformal to the one or more shaped surface areas, and wherein the contact layer is a silicide that comprises nickel silicide, cobalt di-silicide, or erbium di-silicide;
    a metal layer disposed on and adjacent to the contact layer;
    a planarized surface, wherein a portion of the contact layer and a portion of the metal layer are removed selective to the interlayer dielectric; and
    a capping layer disposed on the planarized surface.

2. The semiconductor device of claim 1, wherein the semiconductor device is a field effect transistor comprising the source region and the drain region.

3. The semiconductor device of claim 1, wherein:
    the substrate comprises bulk silicon or a semiconductor-on-insulator, and wherein a portion of the substrate is doped with p-type or n-type dopants; and
    the substrate comprises germanium (Ge), silicon-carbon (SiC), other group IV materials, gallium arsenide (GaAs), aluminum gallium arsenide (AlGaAs), indium arsenide (InAs), or other group III/V materials.

4. The semiconductor device of claim 3, further comprising source-drain extensions formed in a portion of the substrate.

5. The semiconductor device of claim 4, wherein the gate further comprises:
    a gate dielectric layer and a dielectric spacer; and
    a metal layer, poly-silicon layer, or metal and poly-silicon layer disposed on the gate dielectric layer.

6. The semiconductor device of claim 5, wherein:
    the dielectric spacer includes nitride, oxide, any other dielectric material, or a combination thereof; and
    the interlayer dielectric includes nitride, oxide, any other dielectric material, or a combination thereof.

7. The semiconductor device of claim 1, wherein:
    the openings are formed utilizing an etching/removal technique that includes anisotropic RIE, isotropic RIE, wet etching, plasma etching, or ion milling to etch the interlayer dielectric.

8. The semiconductor device of claim 1, wherein:
    the source region further comprises a raised source region;
    the drain region further comprises a raised drain region;
    the raised source region and the raised drain region are at a distance from a transistor channel region;
    the distance from the transistor channel regions is adjustable such that leakage current is mitigated; and
    the source region and the drain region comprise epitaxial material, in-situ doped epitaxial material, ion implanted and annealed semiconductor material, or a combination thereof.

9. The semiconductor device of claim 8, wherein:
    the one or more shaped surface areas are on the raised source region and the raised drain region.

\* \* \* \* \*